(12) United States Patent
Schmitz

(10) Patent No.: US 6,874,112 B1
(45) Date of Patent: Mar. 29, 2005

(54) FAULT COVERAGE AND SIMPLIFIED TEST PATTERN GENERATION FOR INTEGRATED CIRCUITS

(75) Inventor: Lawrence Stanton Schmitz, Irvine, CA (US)

(73) Assignee: Summit Microelectronics, Inc., San Jose, CA (US)

( * ) Notice: Subject to any disclaimer, the term of this patent is extended or adjusted under 35 U.S.C. 154(b) by 489 days.

(21) Appl. No.: 10/059,831

(22) Filed: Jan. 28, 2002

(51) Int. Cl.[7] .......................... G01R 31/28; G06F 17/50
(52) U.S. Cl. .......................... 714/738; 714/734; 716/4
(58) Field of Search .............................. 714/703, 724, 714/725, 733, 734, 741, 742, 738, 739, 31, 32, 33, 35, 37, 38; 716/1, 4, 5

(56) References Cited

U.S. PATENT DOCUMENTS 6,195,776 B1 * 2/2001 Ruiz et al. .................. 714/738
6,311,318 B1 * 10/2001 Souef et al. .................. 716/18
6,363,509 B1 * 3/2002 Parulkar et al. ............. 714/738
6,671,870 B2 * 12/2003 Souef et al. .................. 716/18

* cited by examiner

Primary Examiner—Christine T. Tu
(74) Attorney, Agent, or Firm—Fernandez & Associates LLP

(57) ABSTRACT

An integrated circuit with improved testability includes a test logic component that replaces a corresponding regular logic component and that generates a logic high or low whenever a test input is activated. Alternatively, it may generate either high or low depending on which of two test inputs is activated. A test program may be augmented with instructions to activate such test inputs. An integrated circuit design may be analyzed to select a node that is not covered by a test program and to identify which logic component generates an output on the node. Then the design may be altered to replace the identified logic component with a corresponding test logic component. Test coverage analysis may be based on determining whether the test program toggles the node, or determining whether a stuck at fault on the node propagates so as to be observed.

24 Claims, 8 Drawing Sheets

(a)

(b)

(e)

(f)

(g)

FAULT COVERAGE AND SIMPLIFIED TEST PATTERN GENERATION FOR INTEGRATED CIRCUITS

BACKGROUND INFORMATION

1. Field of the Invention

The present invention relates to the field of testing integrated circuits, and particularly to designing integrated circuits and their associated test programs so as to improve fault coverage.

2. Description of Background Art

Research and technology have provided society with a wide variety of electronic devices. Some modern electronic devices are powerful, and can be very beneficial to those who use them, or very enjoyable. Examples include, but are not limited to: personal computers (PCs), personal digital assistants (PDAs), pagers, mobile phones, portable music playback devices, or game systems. Each of these electronic devices contain one or more integrated circuits (ICs). Moreover, each could not exist in its present form without complex and powerful integrated circuits.

An integrated circuit, or a chip as it is sometimes called, undergoes testing after it is manufactured and before it is assembled into an electronic device or system. Such testing is important because even the most advanced and carefully controlled manufacturing processes produce a percentage of chips that do not work.

Because the wires and transistors within a modern integrated circuit are so small, a speck of dust that gets on the integrated circuit while it is being manufactured, or on the photographic masks or reticules used, is likely to make that particular integrated circuit chip fail to operate properly. There are causes of manufacturing defects or faults other than dust and contaminants, but many of them affect only a single integrated circuit. Thus, careful and thorough testing of each individual integrated circuit is required.

Modern test systems for integrated circuits typically operate under the control of a test program. A test program may specify, among other things, the input signals to apply to the integrated circuit that is being tested as well as what output signals to expect from it. Integrated circuits that do not produce the expected outputs at the expected times may be rejected as defective. Typically, not only does each different integrated circuit design require its own test program, but each change or revision to an IC design requires a corresponding change or revision to the test program.

Modern integrated circuit technology allows literally millions of transistors, wires and other electrical devices to be manufactured on a single integrated circuit. Because of this complexity, it can be difficult or impossible to develop a test program that thoroughly tests every combination of possible input signals, every device on the integrated circuit, or every feature that the integrated circuit implements in every mode in which the integrated circuit can be operated. Even if such a program were available, it may be likely to be too lengthy to be practical; that is, it may not be economical to leave each integrated circuit in a sophisticated and expensive test system long enough to run the entire program.

Because of these practical limits, most test programs are written so as to exercise almost every electrical node within the integrated circuit, or so as to make a failure on almost every node appear as an erroneous output that is observed by a system that is testing the integrated circuit. Coverage of 95% of the nodes is generally considered a suitable target.

However, test programs that cover faults at 95% of the nodes of a complex integrated circuit often have substantial drawbacks, including but not limited to:

Running the test program on the integrated circuit tester often requires longer than desired to keep down the testing time, and thus keep down the cost of manufacturing the integrated circuit;

Developing the test program often requires a substantial amount of engineering time; and The test program often requires change or redesign every time that the, design of the integrated circuit is corrected or improved.

SUMMARY OF THE INVENTION

Accordingly, there is a need for a system and method for improved fault coverage and simplified test pattern generation for integrated circuits.

An integrated circuit includes a test logic component that generates a particular output (e.g. a logic high value or a logic low value) whenever a test input of the test logic component is activated. The integrated circuit also includes a controller that activates the test input during at times during a test mode.

In some embodiments of the invention, the controller puts the integrated circuit into the test mode when a voltage at an input of the integrated circuit rises above a particular threshold. In other embodiments, the test logic component has two test inputs and generates a logic low value or a logic high value depending on which test input is activated.

In various embodiments of the invention, the test logic component generates a function of values on its functional inputs, including but not limited to a NAND function, a NOR function, an OR-AND-INVERT function, an AND-OR-INVERT function, a latch function, a flip flop function, a set-reset flip flop function, a JK flip flop function and a D flip flop function. In some embodiments, the test logic component corresponds to a regular logic component that has a corresponding set of functional inputs and that generates the same function.

Other embodiments of the invention include a program for testing an integrated circuit, the program controlling a process of putting the integrated circuit into a test mode and activating a test input of a logic component within the integrated circuit. The logic component generates a particular output whenever the test input is activated. In some embodiments, the instruction to put the integrated circuit into the test mode includes an instruction to increase a voltage on an input of the integrated circuit to above a particular threshold.

In other embodiments of the invention, the test program may include activating a second test input of the logic component. The logic component generates a logic low value or a logic high value depending on which of its two test inputs is activated.

In some embodiments of the invention, the current or power consumed by the integrated circuit being tested may be monitored, whereby an increase in consumption may suggest a fault in the integrated circuit.

Yet other embodiments of the invention improve the testability of an integrated circuit design, by analyzing the design to select a node of the design that is not covered by a test program, by identifying which logic component within the design generates an output on the node, and by replacing the identified logic component with a test logic component.

In some embodiments of the invention, the test logic component may have a function and a set of functional inputs equivalent to those of the identified logic component, but may differs in that it generates a particular output value whenever its test input is activated. Some embodiments also add to the test program an instruction that activates the test input.

In other embodiments of the invention, the analyzing of the design includes, but is not limited to: determining whether the test program toggles the node, or determining whether a stuck at fault at the node propagates so as to be observed by running the test program.

The invention may be embodied as a circuit, an integrated circuit, a system, a computer aided engineering system, a hardware module, a software module, a method, a media that provides instructions for a programmable device, or a combination thereof

BRIEF DESCRIPTION OF THE DRAWINGS

The above mentioned and other aspects, features and benefits of the invention will be apparent to those skilled in the art after review of the following descriptions and drawings, in which.

DETAILED DESCRIPTION OF PREFERRED EMBODIMENTS

The descriptions, discussions and figures herein illustrate technologies related to the invention, show examples of the invention and give examples of using the invention. Known methods, procedures, systems, circuits or components may be discussed without giving details, so as to avoid obscuring the principles of the invention. On the other hand, numerous details of specific examples of the invention may be described, even though such details may not apply to other embodiments of the invention. Details are included and omitted so as to aid in understanding the invention.

The invention is not to be understood as being limited to or defined by what is discussed herein; rather, the invention may be practiced without the specific details described herein. One skilled in the art will realize that numerous modifications, variations, selections among alternatives, changes in form, and improvements can be made without departing from the principles, spirit or legal scope of the invention.

Some descriptions herein use abstract or general terms including but not limited to module, symbol, number, bit, procedure, step, and block. Those skilled in the art use such terms as a convenient nomenclature for components, data or operations within a computer, digital device or electromechanical system. Such components, data and operations are represented by physical properties of actual objects including but not limited to electronic voltage, magnetic field and optical reflectivity. Similarly, perceptive or mental terms including but not limited to detect, sense, recall, present, compare, control, process, manipulate, analyze, and determine may also refer to such components, data or operations or to manipulations of physical properties.

Figure 1:
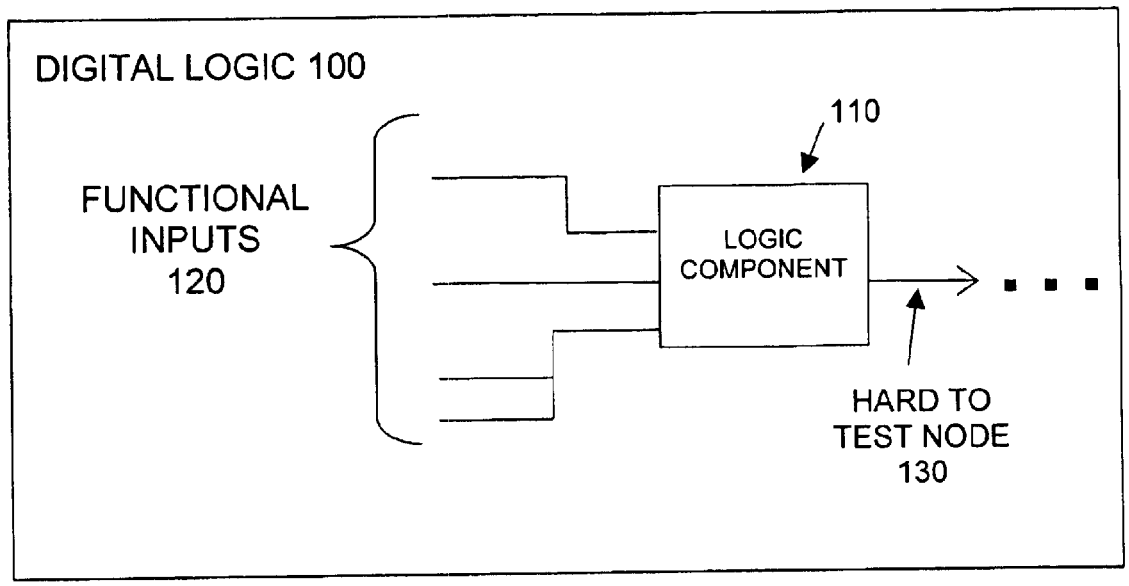
FIG. 1(a) shows a example section of digital logic within an integrated circuit.
FIG. 1(b) illustrates how this same section of logic is modified, according to some embodiments of the invention, by replacing a logic component with a test logic component.
Figure 1:
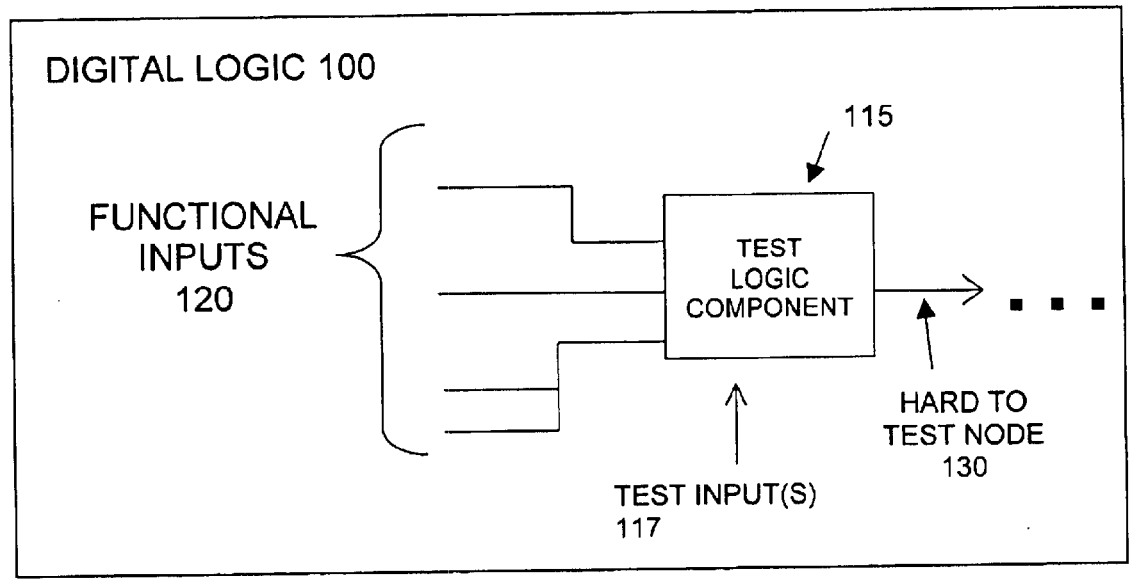

FIG. 1(a) is an abstract logic diagram showing an example digital logic block 100 within an integrated circuit. Digital logic block 100 contains a multiplicity of logic components, including but not limited to logic gates, flip flops and storage. Digital logic, block 100 includes logic component 110 which has one or more functional inputs 120. The output of logic component 110 is node 130. Logic component 110 may be but is not limited to NAND gate 200, NOR gate 240, "OR AND INVERT" component 260 or "AND OR INVERT" component 280.

Assume that node 130 has been identified as being hard to test or as being not covered in a particular test program. This may be done using techniques discussed below. Given this situation, FIG. 1(*b*) illustrates how digital logic block 100 may be modified, according to some embodiments of the invention, by replacing logic component 110 with test logic component 115.

Test logic component 115 differs from logic component 110 in that it has one or more test inputs 117. Both logic component 110 and test logic component 115 share the same functional inputs 120. Except when the integrated circuit is being tested, both logic component 110 and test logic component 115 perform the same operation or function on these inputs to generate the output value on node 130.

Figure 2:
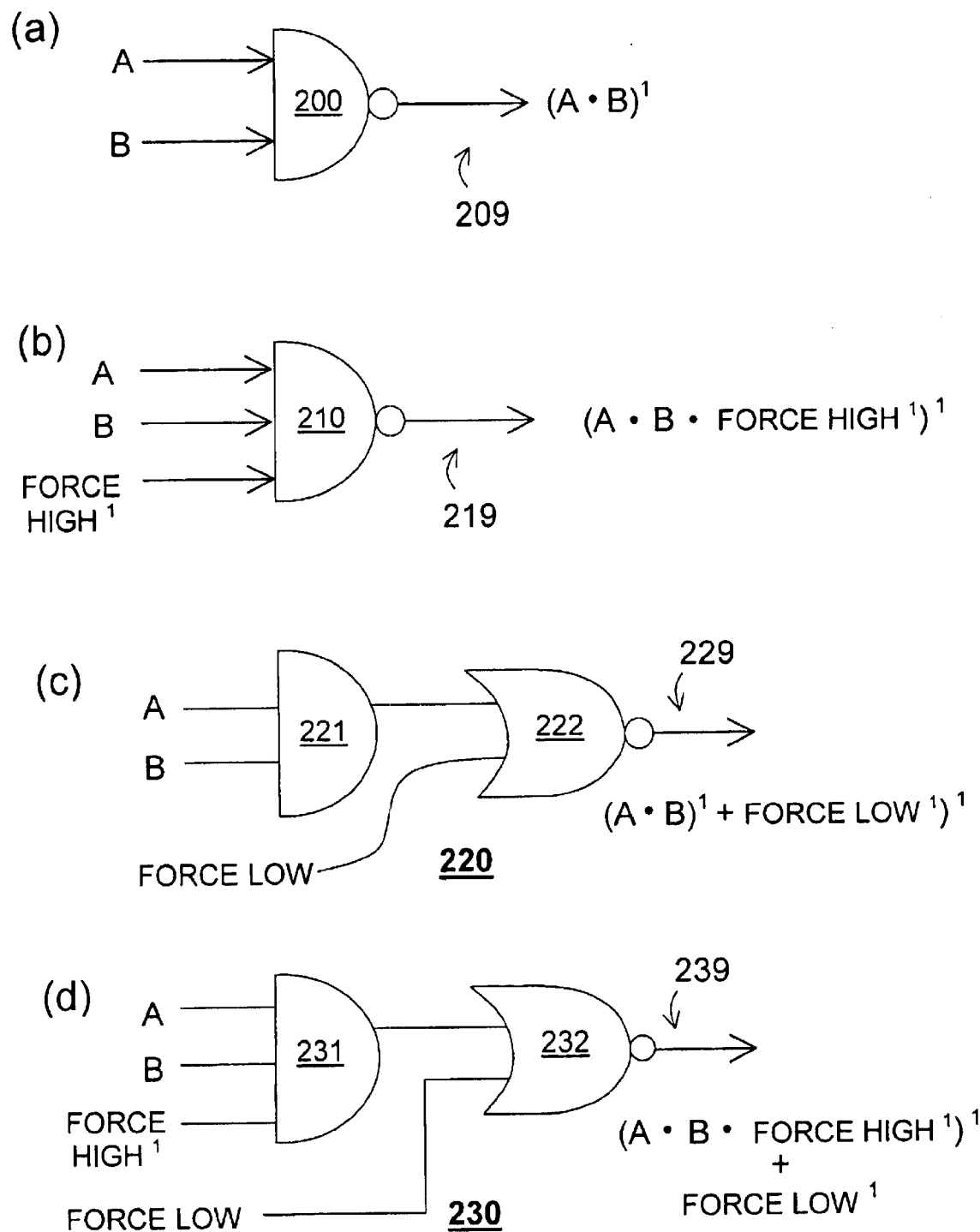
FIG. 2(a) shows an example logic component, specifically a "NOT AND" or logic component or NAND gate, in its regular form.
FIG. 2(b) illustrates how this same NAND gate may be modified, according to some embodiments of the invention, to always generate a logic high output whenever a Force High test input is activated.
FIG. 2(c) shows how this same NAND gate may be modified, according to other embodiments of the invention, to always generate a logic low output whenever a Force Low test input is activated.
FIG. 2(d) illustrates how this same NAND gate may be modified, according to yet other embodiments of the invention, to generate a logic high output whenever a Force High test input is activated and to generate a logic low output whenever a Force Low test input is activated.
FIG. 2(e) shows another example logic component, specifically a "NOT OR" logic component or NOR gate, in its regular form.
FIG. 2(f) illustrates how such a NOR gate may be modified, according to some embodiments of the invention, to generate a logic high output whenever a Force High test input is activated and to generate a logic low output whenever a Force Low test input is activated.
FIG. 2(g) shows yet another example logic component, specifically a "OR AND INVERT" logic component, in its regular form.
FIG. 2(h) illustrates how such an "OR AND INVERT" logic component may be modified, according to some embodiments of the invention, to generate a logic high output whenever a Force High test input is activated and to generate a logic low output whenever a Force Low test input is activated.
FIG. 2(i) shows still another example logic component, specifically an "AND OR INVERT" logic component, in its regular form.
FIG. 2(j) illustrates how such a "AND OR INVERT" logic component may be modified, according to some embodiments of the invention, to generate a logic high output whenever a Force High test input is activated and to generate a logic low output whenever a Force Low test input is activated.
Figure 2:
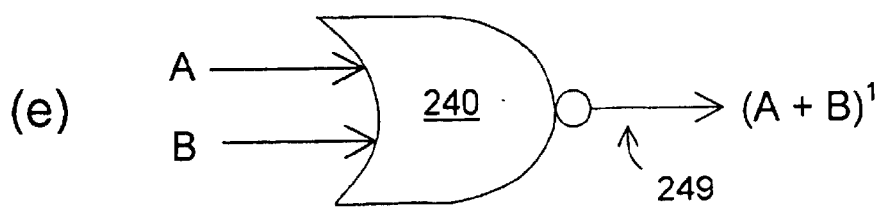
Figure 2:
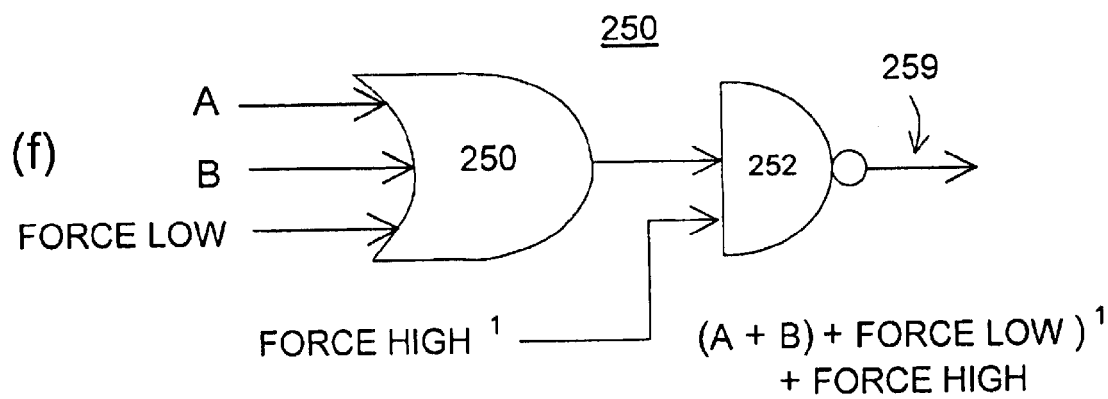
Figure 2:
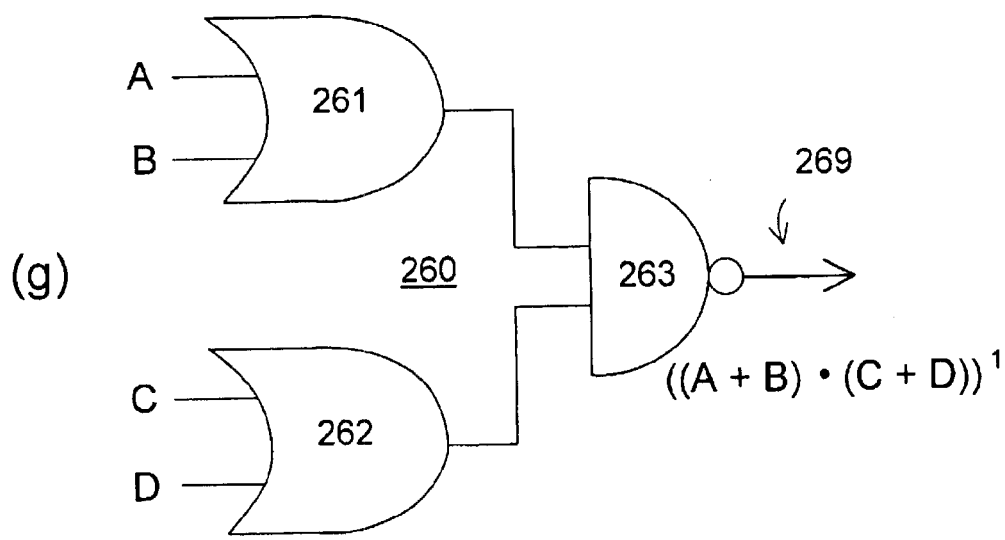
Figure 2:
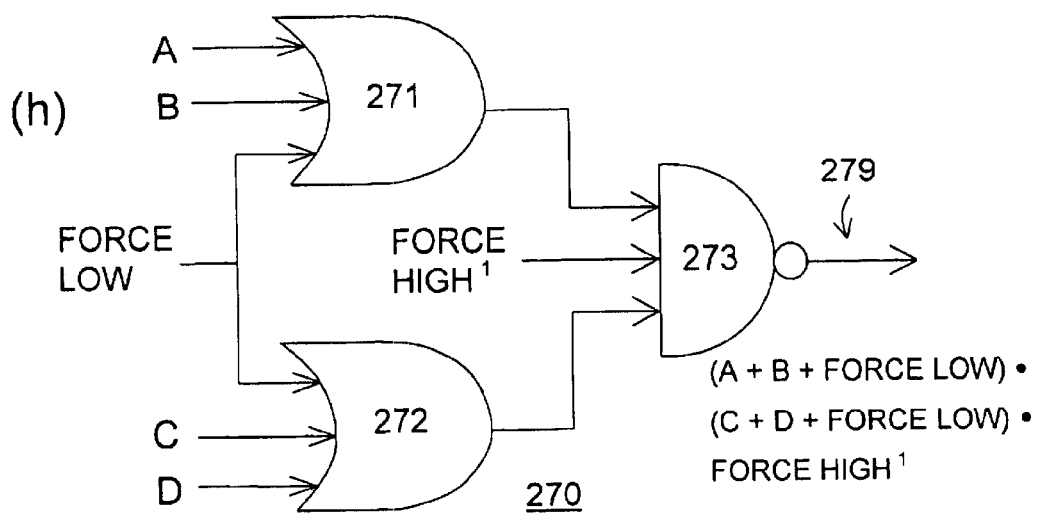
Figure 2:
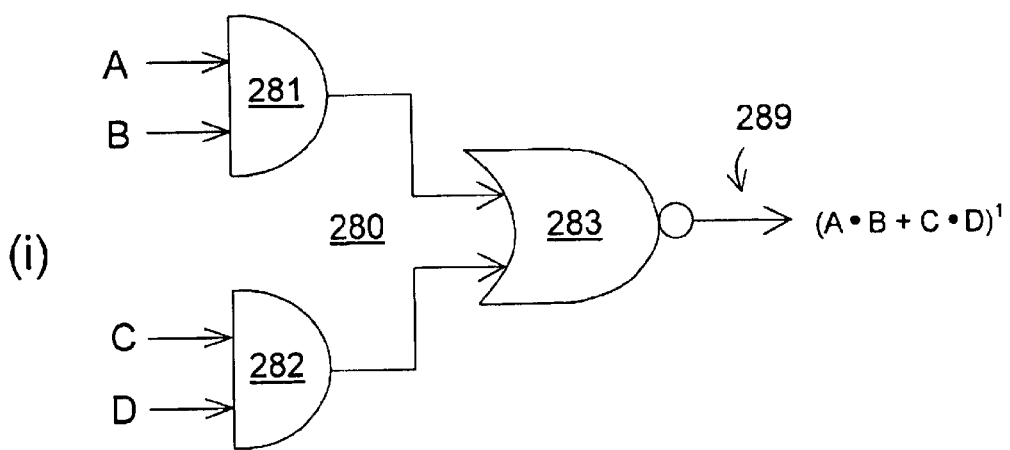
Figure 2:
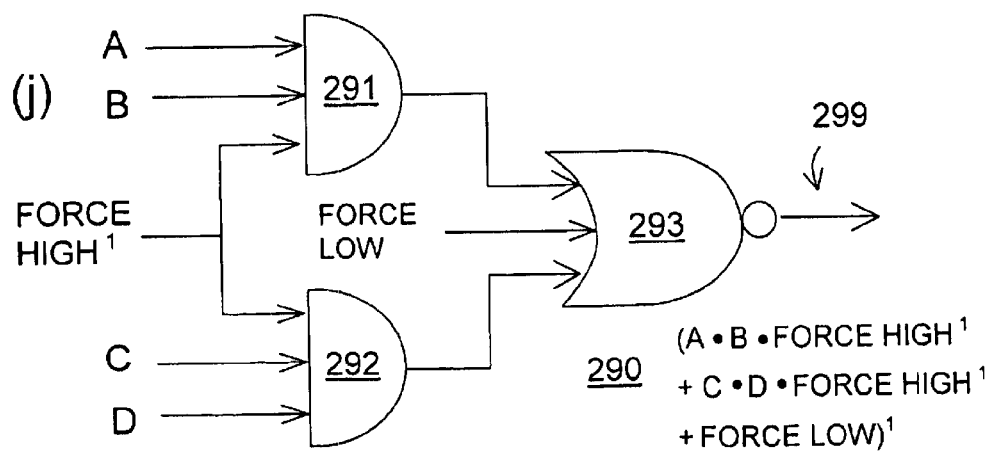

FIG. 2(*a*) shows example logic component 200, specifically a NAND gate, in its regular form. The functional inputs of NAND gate 200 are the logic values on nodes A and B. The output 209 of NAND gate 200 is the function (A*B)' of these values; that is both A and B must be high in order for output 209 to be low.

FIG. 2(*b*) is a logic diagram illustrating how a NAND gate may be modified, according to some embodiments of the invention, to form test logic component 210. Test logic component 210 always generates a logic high output whenever the Force High test input is activated. The embodiment shown uses negative logic for the Force High test input; that is, the test input signal is active low and Force High'is the signal used as an input to test logic component 210. The output 219 of test logic component 210 is the function (A*B*Force High')'; that is in order for output 219 to be low each of A, B and Force High' must be high.

FIG. 2(*c*) is a logic diagram showing how a NAND gate may be modified, according to other embodiments of the invention, to form test logic component 220. Test logic component 220 includes AND gate 221 and NOR gate 222. Test logic component 220 always generates a logic low output whenever the Force Low test input is activated. The output 229 of test logic component 220 is the function (A*B+Force Low)'; that is in order for output 229 to be low either each of A and B are high, or Force Low is high.

FIG. 2(*d*) is a logic diagram illustrating how a NAND gate may be modified, according to yet other embodiments of the invention, to form test logic component 230. Test logic component 230 includes AND gate 231 and NOR gate 232. Test logic component 230 generates a logic low output whenever the Force Low test input is activated and a logic high output whenever the Force High test input is activated. Output 239 of test logic component 230 is the function ((A*B*Force High')+Force Low)'; that is in order for output 239 to be low either both of A and B are high and Force High' is low, or Force Low is high. In the embodiment shown, the Force High test input is active low.

In some embodiments of the invention, it is immaterial what output results when both Force High and Force Low on a particular test logic component are active because test controller 470 should never generate that combination of test input signals.

When node 130, that is the output of logic component 110, is identified as being hard to test or not covered in a particular test program, then logic component 110 may be replaced with logic component 115. For example, if logic component 110 is an instance of NAND gate 200, than logic component 110 may be replaced with test logic component. 210, test logic component 220 or test logic component 230.

The choice among test logic component 210, test logic component 220 or test logic component 230 may be made based on factors including but not limited to the following:

If it is known that node 130 is predominantly in a low state based on the output of the regular logic component, then only the Force High' test input of test logic component 210 is needed. In this case, the use of test logic component 230 may result in a larger chip area or slower chip performance than using test logic component 210. Further, the use of larger test logic component 230 may not provide any increase in testability over the use of smaller test logic component 210.

Similarly, if it is known that node 130 is predominantly in a high state based on the output of the regular logic component, then test logic component 220 may be appropriate.

However, the more specialized test logic components 210 or 220 may not be available in the design environment being used, particularly if their layouts must be handcrafted as a special cell. In this case, test logic component 230 can be used regardless of the predominant state of node. 130.

In some embodiments of the invention, the cost of manually designing and testing test logic components may limit how many are available as add ons to the design library, particularly if the current design library contains a substantial number of cells each of; which needs a test component counterpart.

FIG. 2(*e*) is a logic diagram of example logic component 240, specifically a NOR gate in its regular form. FIG. 2(*f*) is a logic diagram illustrating how a NOR gate may be modified, according to some embodiments of the invention, to form test logic component 250. Test logic component 250 includes OR gate 251 and NAND gate 252. Test logic component 250 generates on output 259 the NOR function when neither test input is active, generates a logic low output whenever the Force Low test input is activated, and generates a logic high output whenever the Force High test input is activated.

FIG. 2(*g*) is a logic diagram of another example logic component 260, specifically an "OR AND INVERT" logic component in its regular form. Logic component 260 includes OR gates 261 and 262 as well as NAND gate 263.

FIG. 2(*h*) is a logic diagram illustrating how such an "OR AND INVERT" logic component may be modified, according to some embodiments of the invention, to form test logic component 270. Test logic component 270 includes OR gates 271 and 272 as well as NAND gate 273. Test logic component 270 generates on output 279 the "OR AND INVERT" logic function whenever neither test input is active, generates a logic high output whenever a Force High test input is activated, and generates a logic low output whenever a Force Low test input is activated.

FIG. 2(*i*) is a logic diagram of another example logic component 280, specifically an "AND OR INVERT" logic component, in its regular form. Logic component 280 includes AND gates 281 and 282 as well as NOR gate 283.

FIG. 2(*j*) is a logic diagram illustrating how such an "AND OR INVERT" logic component may be modified, according to some embodiments of the invention, to form test logic component 290. Test logic component 290 includes AND gates 291 and 292 as well as NOR gate 293. Test logic component 290 generates on output 299 the "AND OR INVERT" function whenever neither test input is active, generates a logic high output whenever a Force High test input is activated, and generates a logic low output whenever a Force Low test input is activated.

Figure 3:
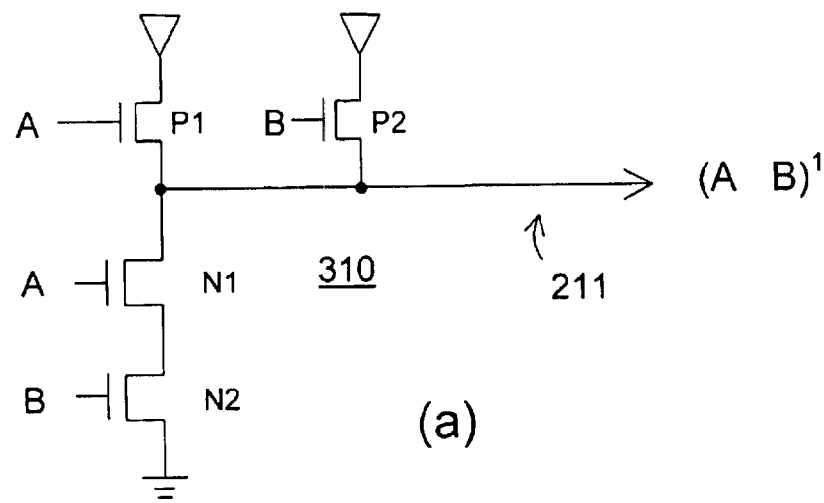
FIG. 3(a) shows the example regular NAND logic component of FIG. 2(a) in the form of transistors and their interconnections.
FIG. 3(b) illustrates in the form of transistors and their interconnections the example NAND logic component with the Force High and Force Low test input, according to some embodiments of the invention.
Figure 3:
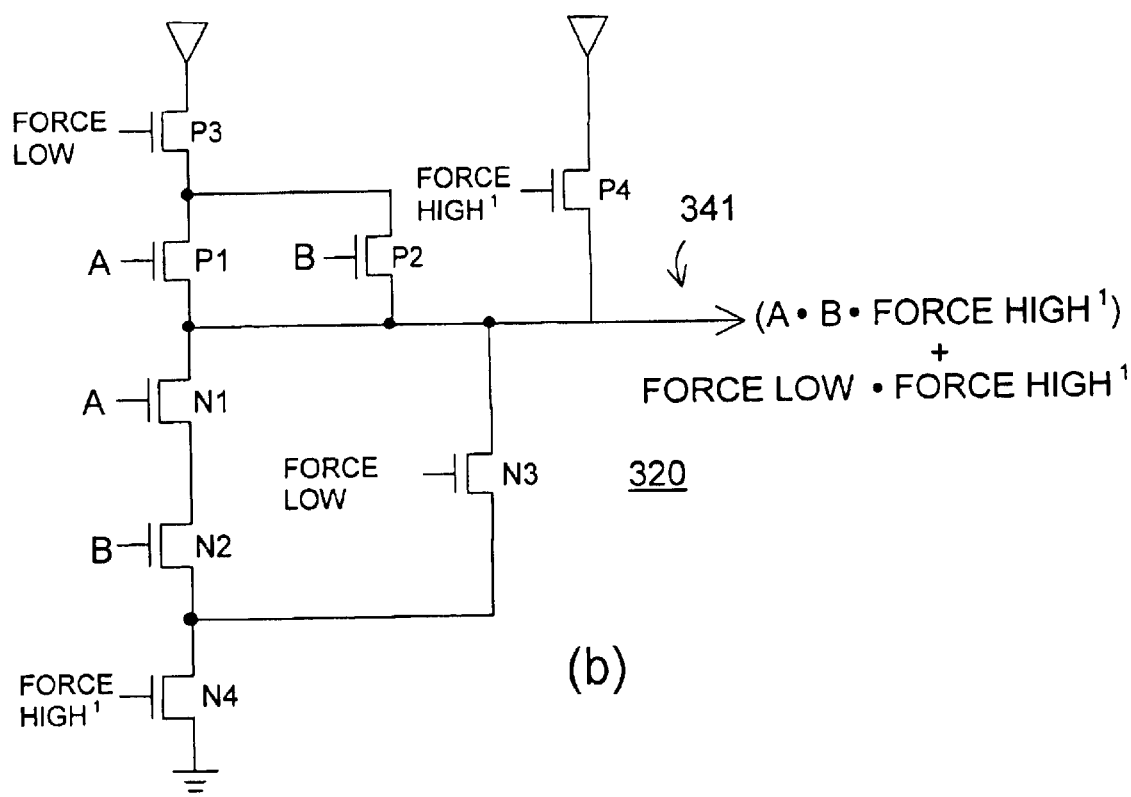

FIG. 3(*a*) is a circuit diagram showing the example regular NAND gate 210. Circuit 310 is based on complementary metal oxide silicon (CMOS) transistors. Circuit 310 is based on positive logic; that is, a logic high or true is represented using a positive voltage level.

In NAND gate circuit 310, P channel transistor P1 is turned on whenever node A is low. In parallel to P1, P channel transistor P2 is turned on whenever node B is low, thus either A or B being low pulls output node 211 high. N channel transistor N1 is turned on whenever node A is high. In series with N1, N channel transistor N2 is turned on whenever node B is high, thus both A and B being high pulls output node 211 low.

FIG. 3(*b*) illustrates, according to some embodiments of the invention, a circuit diagram for the example test logic component of FIG. 2(*d*) with Force High and Force Low test inputs. Circuit 320 is based on CMOS positive logic.

In test component circuit 310, transistors P1, P2, N1 and N2 function equivalently to those of NAND gate circuit 310. P channel transistor P3 is turned on whenever node Force Low is low, thus allowing P1 or P2 to pull up output 341 when Force Low is not asserted. N channel transistor N3 is turned on whenever node Force Low is high, thus allowing pulling down output 341 when Force Low is asserted and Force High is not asserted.

In series with N1 and N2, N channel transistor N4 is turned on whenever node; Force High' is high, thus asserting Force High disables N1 and N2 from pulling down output 341. In parallel with the combination of P1, P2 and P3, P channel transistor P4 is, turned on whenever node Force High' is low, thus pulling output 341 high whenever; Force High is asserted.

It will be obvious to one skilled in the art how circuit 320 may be simplified to form test component 210 with only a Force High' test input, or test component 220 with only a Force Low test input. It will also be obvious how circuits 310 and 320 may be modified for technologies other than CMOS.

Further, it will be obvious to one skilled in the art how test logic components may be constructed to correspond to other regular logic components, including but not limited to those shown in FIG. 2. In the case of gates and logic without memory, the regular component may be modified to have one input that forces the desired value on the output, or to have two inputs that force either value on the output.

In the case of one bit storage elements such as latches and flip flops, the regular component may be modified, according to some embodiments of the invention, to have at least one input that forces a desired value to be retained as the value of the storage element. For example, D flip flops and JK flip flops could be augmented with a Set input to function as a Force High, a Reset input to function as a Force Low, or both.

Alternatively or additionally, other embodiments of the invention may modify a regular storage component to have at least one input that forces a desired value on the output of the test logic component without modifying the value stored in the logic component.

Many latches and flip flops have asynchronous inputs such as Set or Reset, and many have synchronous inputs such as a D input or J and K inputs. Various embodiments of the invention may use synchronous or asynchronous inputs for the test inputs.

Figure 4:
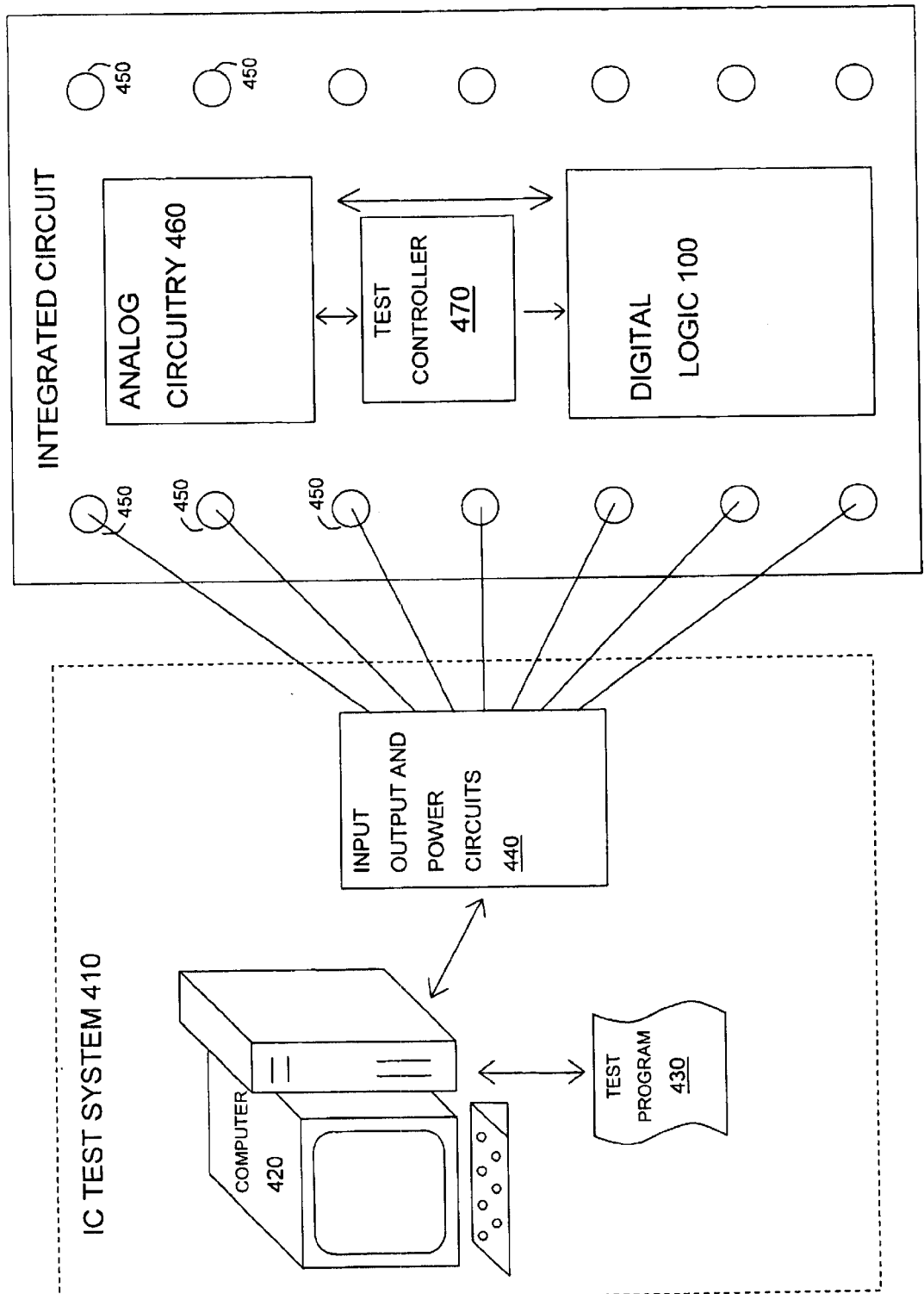
FIG. 4 shows how, according to some embodiments of the invention, an integrated circuit test system and a test controller within the integrated circuit being tested interconnect with a section of digital logic within the integrated circuit.

FIG. 4 is a system diagram, according to some embodiments of the invention, showing how IC test system 410 interconnects with integrated circuit 460, which is being tested.

Integrated circuit 460 includes input, output and power pins, pads or connections 450, digital logic block 100 and test controller 470. Optionally, integrated circuit 460 may contain analog circuitry 460.

IC test system 410 may be any system capable of testing integrated circuit 460. In the embodiment shown, it includes test program 430, input output and power circuits 440 and computer system 420.

Input, output and power circuits 440 provide power to integrated circuit 460 via one or more pins 450. Input, output and power circuits 440 also provide input signals to integrated circuit 460 via one or more pins 450. In addition, input, output and power circuits 440 monitor the output input signals from integrated circuit 460 via one or more pins 450.

In some embodiments of the invention, input, output and power circuits 440 also monitor the power consumption of integrated circuit 460, including but not limited to the quiescent current or $I_{ddQ}$. Many faults in an integrated circuit can be modeled as the effect of forcing a node within the integrated circuit to be stuck at either a high or a low value. In some cases, attempting to drive that node into the opposite state creates a circuit path that bridges power and ground, thus consuming an unusual amount of power while the driving attempt continues. When an unusually large amount of power is consumed during the execution of test program 430, there may be a fault in the integrated circuit, perhaps in a node that is activated at that step.

This power monitoring technique is particularly valuable in but not limited to CMOS circuits. In CMOS circuits, the quiescent current for a fault free integrated circuit (that is, $I_{ddQ}$ or the current consumed in a steady state after all nodes settle after a clock or timing signal transition) may be a factor of 10 lower than the current consumed when a fault is activated.

Integrated circuit test system 410 also includes a representation of test program 430 on a computer readable media. Test program 430 controls the process of testing integrated circuit 460, including but not limited to:

Specifying the power supply voltages and acceptable current ranges;

Specifying the logic and timing of the input signals provided to integrated; circuit 460;

Specifying the logic and timing of the output signals acceptable from integrated circuit 460; and Specifying instructions to test controller 470.

Specifying that a voltage on one or more pins 450 be raised, which in some embodiments of the invention causes test controller 470 to place integrated circuit 460 into a test mode.

In this mode, the input signals provided from IC test system 410 to integrated circuit 460 may have meanings that are interpreted by test controller 470, and that are different from what the same input signals would mean when not in test mode.

The use of increased voltage and test mode input signals may eliminate the need for some of pins 450 on integrated circuit 460 to be dedicated to testing functions. Not having pins that are dedicated to testing may lower the size and manufacturing cost of integrated circuit 460. In particular, the test inputs of various test logic components within digital logic 100 may be activated using these techniques in some embodiments of the invention.

Figure 5:
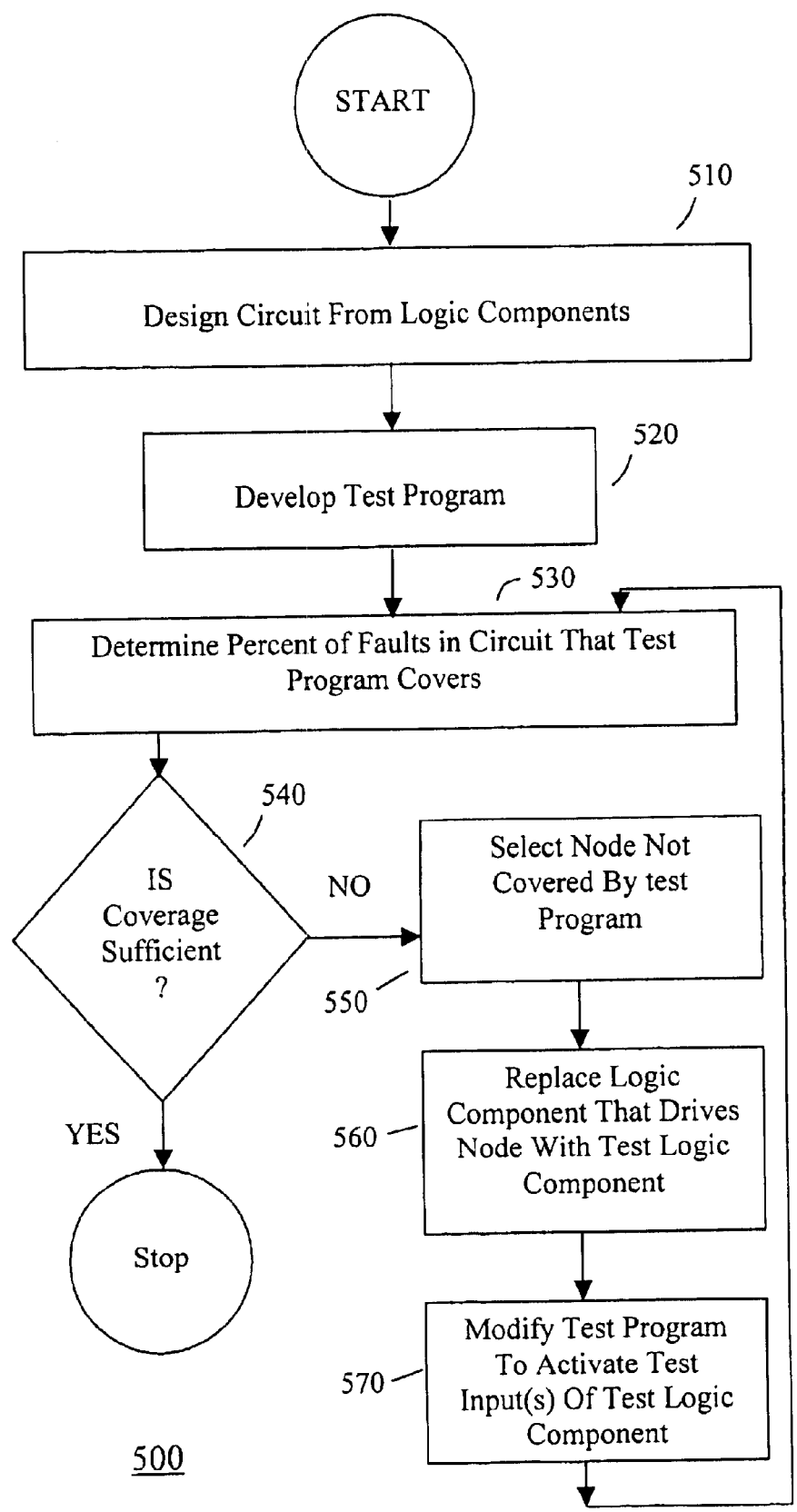
FIG. 5 illustrates the sequence of steps performed, according to some embodiments of the invention, to modify an integrated circuit design and the test program associated with it to improve the testability of the integrated circuit.

FIG. 5 is a flow chart, according to some embodiments of the invention, of modifying an IC design and its associated test program to improve the testability of the integrated circuit.

In steps 510 and 520, an IC design is developed along with a corresponding test program 430. It will be obvious to one skilled in the art that these can be predominantly manual steps or predominantly an automatic process. The automation level depends on factors such as the sophistication of the computer aided engineering tools used, the scope and complexity of the design, the portions of the design that are available as designs of similar ICs or as complex cores, and the availability of libraries of cells and other relatively low level logic components.

In step 530, a measure is determined of how well the current version of test program 430 detects faults within the current version of the IC design. Typically, but not necessary, this measure is expressed as a percent of the electrical nodes within the IC design that are covered by test program 430.

In some embodiments of the invention, a node may be considered covered if sometime during the execution of test program 430 the node definitely toggles, that is goes from a high to a low, or visa versa, or both. In these embodiments, step 530 may include a logic level simulation of how integrated circuit 460 behaves under the control of test program 430.

In other embodiments of the invention, a node may be considered covered if sometime during the execution of test program 430 both a stuck at low fault on the node and a stuck at high fault on the node migrate to where they can be observed by IC test system 410. In these embodiments, step 530 may include a fault simulation of how integrated circuit 460 behaves under the control of test program 430.

If the fault coverage is sufficiently high, then step 540 terminates process 500. Otherwise step 550 is next, in which at least one node within integrated circuit 460 is selected that is not covered by test program 430. The results of either the simulation or the fault simulation performed in step 530 can be used to identify a set of nodes that are candidates for testability enhancement because they are not covered.

In step 550, at least one of the candidate nodes is selected to be enhanced. This selection process may be primarily manual; that is, the computer aided engineering that implements portions of process 500 may identify which nodes are not covered and inform the IC designer who is using the system. Then, the IC designer may select which of those nodes to enhance and input his selections into the system. Alternatively, the selection process may be entirely automatic; for example, all nodes not covered may be selected for enhancement.

As another example, the system may randomly select which of the nodes not covered to enhance, which may be limited such that the IC design does not exceed a maximum number or percentage of enhanced nodes. In some embodiments of the invention, such limitations on the quantity of enhanced nodes may be required to meet constraints on circuit speed or circuit size.

Next in step 560 for each selected node, the logic component that drives that node is identified and replaced with a corresponding test logic component. Care must be taken this step to correctly handle those nodes in the design that may have multiple drivers, including but not limited to busses and tri-state logic. In some embodiments, the set of, available test logic components may include test components that suitable for such nodes with multiple signal sources.

Next in step 570, test program 430 is modified to activate at least one of the test input(s) of the test logic components that have just been added to the IC design. For embodiments of the invention that use toggling nodes as a fault coverage criterion, it may be sufficient to merely activate the appropriate test inputs of the test logic components. Other embodiments based on propagating stuck at faults may, use the automatic test pattern generation techniques known in the art to further add steps to test program 430 such that a faults on nodes generated by activating test inputs become observable to IC test system 410 at the outputs of the IC design.

Next, the fault coverage measurement process of step 530 is repeated. This, completes the description of process 500 in which an IC design and the test program associated therewith are modified to enhance the testability of integrated circuits manufactured according to that design.

Figure 6:
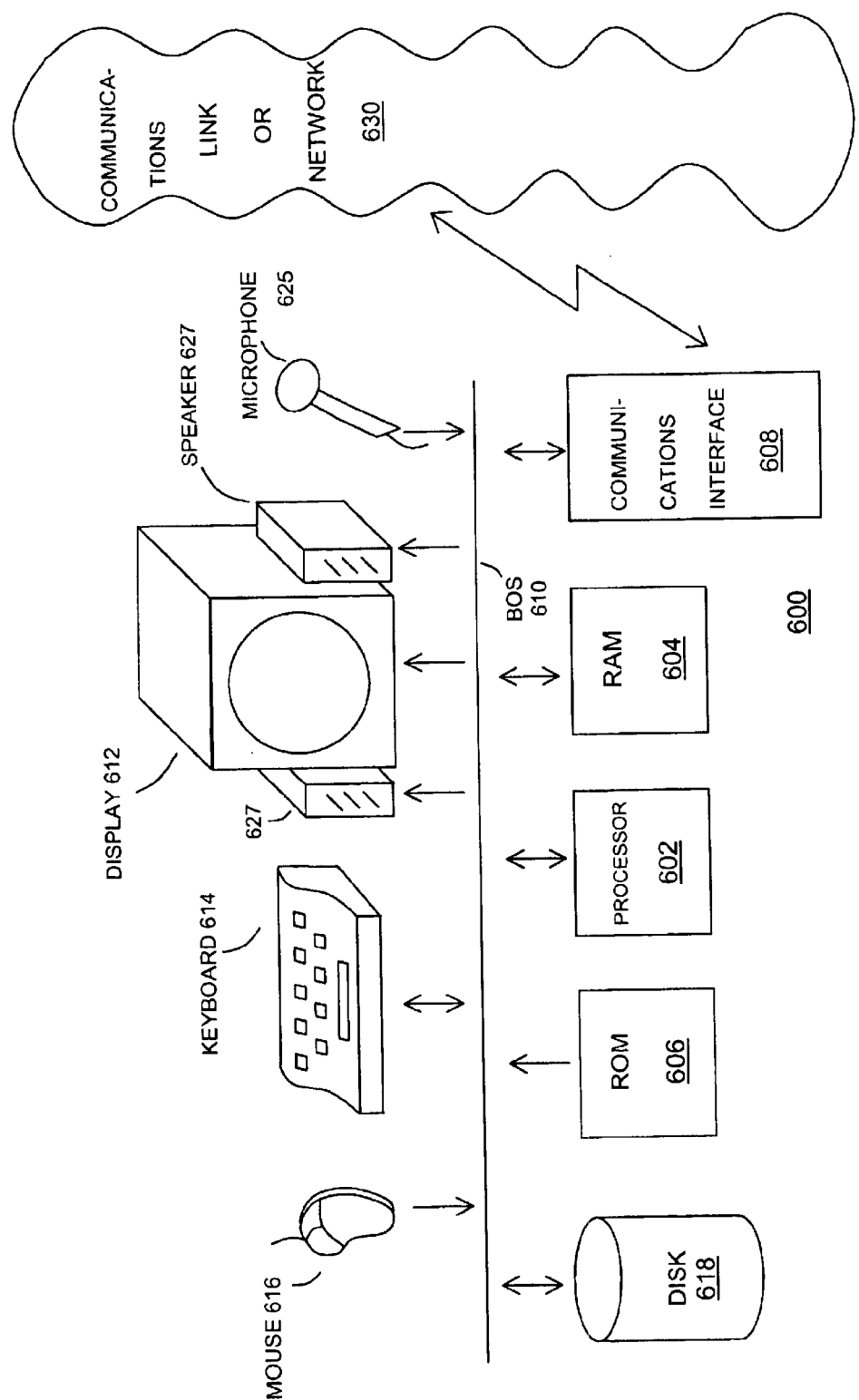
FIG. 6 shows the functional components and their interconnections of an example computer system that may be used in various embodiments of the invention.

FIG. 6 is a block diagram of an example computer system that can be used in some embodiments of the invention. Computer system 600 is not limited to being a typical personal computer but it may be any type of computing device, including but not limited to a server or a portable computing device.

Computer system 600 and variants thereon may be employed in various embodiments of the invention including but not limited to being used as computer system 420 within IC test system 410, or as the mechanism that implements all or part of process 500.

Computer system 600 comprises one or more buses 610 configured to communicate information including addresses, op codes and data. The computer system also comprises one or more processors 602 configured to process information and data according to instructions and other data. The processor may be but is not limited to a central processing unit, a microprocessor, an embedded processor, or a special purpose processor.

Computer system 600 may optionally include RAM 604, that is, one or more volatile memory units or other devices or circuits configured to store information, data and instructions. RAM 604 may be but is not limited to random access memory (RAM), static RAM, or dynamic RAM. RAM 604 is coupled to bus 610.

Computer system 600 may optionally include ROM 606, that is, one or more nonvolatile memory units or other devices or circuits configured to store static information and instructions. ROM 606 may include, but is not limited to: read only memory (ROM), programmable ROM, flash memory, electrically programmable ROM (EPROM), or erasable electrically programmable ROM (EEPROM). ROM 606 is coupled with bus 610.

Computer system 600 may optionally include communication interface 608, that, is, one or more devices or circuits configured to interface with another electronic device via communication link or network 630. Communication link or network 630 may include but is not limited to one or more local area networks, corporate intranets or the Internet.

Communication interface 608 is coupled to bus 610 and may be based on wired communication technology, wireless communication technology, or both. The communications interface may be a serial communication port, a Universal Serial Bus (USB), an Ethernet adapter, an IEEE 1394 bus interface, a parallel port, a small computer system interface (SCSI) bus interface, an infrared (IR) communication port, a Bluetooth wireless communication adapter, a broadband connection, or a connection to the Internet, among others.

Computer system 600 may optionally include keyboard 614, that is, one or more alphanumeric input devices configured to communicate information and command selections from a user. Keyboard 614 may, for example, have alphabetic, numeric, function and control keys, buttons, selectors or touch-sensitive screens. The keyboard is coupled to bus 610.

Computer system 600 may optionally include mouse 616, that is, one or more cursor control, indicating, selecting or pointing devices configured to communicate analog, quantitative or selection user input information and command selections to processor 602. Mouse 616 may be a mouse, a track ball, a track pad, an optical tracking device, a joystick, a game controller, a touch screen, or a glove, for example. The mouse is coupled to bus 610. Alternatively or additionally, the functions of mouse 616 may be directed or activated via input from keyboard 614 using special keys, key sequences or commands.

Computer system 600 may optionally include one or more devices configured to sense, process, generate and recognize voice commands, responses or other words. Voice recognition may replace or augment the functions of keyboard 614, mouse 616, or both. Such devices may include, but are not limited to: microphone 625 or speaker 627, which may also be used for audio capture and reproduction of, for example, speech, singing and, music.

Computer system 600 may optionally include disk 618, that is, one or more devices or circuits configured to store sizable amounts of information, data or instructions. Disk 618 may include, but is not limited to: a mass storage device, a magnetic disk, an optical disk, a compact disk (CD), a writeable CD, a digital versatile disk (DVD), a hard disk, a floppy disk, a flash memory or a memory stick. Disk 618 is coupled to bus 610.

Computer system 600 may optionally include display 612, that is, one or more devices or circuits configured to display pictures, video, text or graphics. Display 612 may include, but is not limited to: a cathode ray tube (CRT), a flat panel display, a liquid crystal display (LCD), a field emission display (FED), or a heads up display suitable for use in a vehicle. Display 612 is coupled to bus 610.

Certain operations, processes and steps are discussed herein that may be realized, in some embodiments of the invention, as a series of instructions, including but not limited to codes, commands, program operation codes (op codes), pseudo codes. (p-codes), firmware or software. These instructions may be executed by various components of the system, including but not limited to: processor 602, programmable controllers within communications interface 608, or programmable controllers within, disk 618.

When executed, the instructions control computer system 600 such that it performs specific actions and exhibits specific behavior as described herein. Representations of these instructions may reside within, or be made available via, various media. Such media include but are not limited to: memory devices, floppy disks, CDs, DVDs, computer readable media, or information streams such as those that may be made available via communications interface 608.

Accordingly, the invention as described herein provides a method and system for improved fault coverage and simplified test pattern generation for integrated circuits.

The foregoing drawing figures and descriptions are not intended to be exhaustive or to limit the invention to the forms disclosed. Rather, they are presented for purposes of illustrating, teaching and aiding in the comprehension of the invention. The invention may be practiced without the specific details described herein. Numerous selections among alternatives, changes in form, and improvements can be made without departing from the principles, spirit or essence of the invention. The invention can be modified or varied in light of the teachings herein, the techniques known to those skilled in the art, and advances in the art yet to be made.

The scope of the invention for which a patent is sought is set forth by the following claims and their legal equivalents.

I claim:

1. A method of improving testability of an integrated circuit design, the method comprising:
   analyzing an integrated circuit design to select a node of the design that is not covered by a test program;
   identifying which of a multiplicity of logic components within the design generates an output on the node; and
   replacing the identified logic component with a test logic component having a function and a set of functional inputs equivalent to those of the identified logic component, wherein the test logic component has a test input and generates, whenever the test input is activated, a particular output value on the node.

2. The method of claim 1, further comprising:
   adding to the test program an instruction to activate the test input.

3. The method of claim 1, wherein the particular output value is selected from a logic high value and a logic low value.

4. The method of claim 1, wherein the function is selected from a NAND function, a NOR function, an OR-AND-INVERT function, an AND-OR-INVERT function, a latch function, a flip flop function, a set-reset flip flop function, a JK flip flop function and a D flip flop function.

5. The method of claim 1, wherein the test program includes an instruction to increase above a particular threshold a voltage at an input of an integrated circuit being tested, thereby putting the integrated circuit into a test mode during which the test input is activated.

6. The method of claim 1, wherein the analyzing includes a method selected from determining whether the test program toggles the node and determining whether a stuck at fault at the node propagates so as to be observed by running the test program.

7. A media containing instructions that when read and executed by a computer control a process for improving the testability of an integrated circuit design, the process comprising:
   analyzing an integrated circuit design to determine a node of the design that is not covered by a test program;
   identifying which of a multiplicity of logic components within the design generates an output on the node; and
   replacing the identified logic component with a test logic component having a function and a set of functional inputs equivalent to those of the identified logic component, wherein the test logic component has a test input and generates, whenever the test input is activated, a particular output value on the node.

8. The media of claim 7, wherein the process further comprises:
   adding to the test program an instruction to activate the test input.

9. The media of claim 7, wherein the particular output value is selected from a logic high value and a logic low value.

10. The media of claim 7, wherein the function is selected from a NAND function, a NOR function, an OR-AND-INVERT function, an AND-OR-INVERT function, a latch function, a flip flop function, a set-reset flip flop function, a JK flip flop function and a D flip flop function.

11. The media of claim 7, wherein the test program includes an instruction to increase above a particular threshold a voltage at an input of an integrated circuit being tested, thereby putting the integrated circuit into a test mode during which the test input is activated.

12. The media of claim 7, wherein the analyzing includes a method selected from determining whether the test program toggles the node and determining whether a stuck at fault at the node propagates so as to be observed by running the test program.

13. An means for improving the testability of an integrated circuit design, the means comprising:

a means for analyzing an integrated circuit design to determine a node of the integrated circuit design that is not covered by a test program;

a means for identifying which of a multiplicity of logic means within the design generates an output on the node; and a means for replacing the identified logic means with a test logic means having a function and a set of functional inputs equivalent to those of the identified logic means, wherein the test logic means has a test input and generates, whenever the test input is activated, a particular output value on the node.

14. The means of claim 13, further comprising:

adding to the test program an instruction to activate the test input.

15. The means of claim 13, wherein the particular output value is selected from a logic high value and a logic low value.

16. The means of claim 13, wherein the function is selected from a NAND function, a NOR function, an OR-AND-INVERT function, AND-OR-INVERT function, a latch function, a flip flop function, a set-reset flip flop function, a JK flip flop function and a D flip flop function.

17. The means of claim 13, wherein the test program includes an instruction to increase above a particular threshold a voltage at an input of an integrated circuit being tested, thereby putting the integrated circuit into a test mode.

18. The means of claim 13, wherein the analyzing means includes a means selected from a means for determining whether the test program toggles the node and a means for determining whether a stuck at fault at the node propagates so as to be observed by running the test program.

19. An apparatus programmed to improve the testability of an integrated circuit design, the apparatus comprising:

a test coverage analysis module configured to determine a node within an integrated circuit design that is not covered by a test program;

an circuit analysis module configured to identify which of a multiplicity of logic components within the design generates an output on the node; and a circuit modification module configured to replace the identified logic component with a test logic component having a function and a set of functional inputs equivalent to those of the identified logic component, wherein the test logic component has a test input and is configured to generate, whenever the test input is activated, a particular output value on the node.

20. The apparatus of claim 19, further comprising:

a test program modification module configured to add to the test program an instruction to activate the test input.

21. The apparatus of claim 19, wherein the particular output value is selected from a logic high value and a logic low value.

22. The apparatus of claim 19, wherein the function is selected from a NAND function, a NOR function, an OR-AND-INVERT function, AND-OR-INVERT function a latch function, a flip flop function, a set-reset flip flop function, a JK flip flop function and a D flip flop function.

23. The apparatus of claim 19, wherein the test program includes an instruction to increase above a particular threshold a voltage at an input of an integrated circuit being tested, thereby putting the integrated circuit into a test mode.

24. The apparatus of claim 19, wherein the analyzing includes a method selected from determining whether the test program toggles the node and determining whether a stuck at fault at the node propagates so as to be observed while running the test program.

* * * * *